US006523748B1

(12) United States Patent
Nishikata

(10) Patent No.: US 6,523,748 B1
(45) Date of Patent: Feb. 25, 2003

(54) SUBSTRATE FOR EXPOSURE, READOUT METHOD AND APPARATUS FOR THE SUBSTRATE, EXPOSURE APPARATUS, AND METHOD FOR PRODUCING SEMICONDUCTOR DEVICES USING THE EXPOSURE APPARATUS

(75) Inventor: Akio Nishikata, Kitamoto (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/514,582

(22) Filed: Feb. 28, 2000

(30) Foreign Application Priority Data

Mar. 2, 1999 (JP) ............................ 11-054816

(51) Int. Cl.⁷ .................. G06K 7/10; G06K 5/04
(52) U.S. Cl. .................. 235/462.08; 235/462.01; 235/462.05; 235/462.12
(58) Field of Search ............ 235/462.05, 462.08, 235/462.12, 462.01

(56) References Cited

U.S. PATENT DOCUMENTS

| | | | | |
|---|---|---|---|---|
| 4,567,361 A | * | 1/1986 | Rosenthal | ............ 235/385 |
| 5,329,107 A | * | 7/1994 | Priddy et al. | ............ 235/494 |
| 5,442,163 A | | 8/1995 | Nakahara et al. | ............ 235/381 |
| 6,032,861 A | * | 3/2000 | Lemelson et al. | ............ 235/456 |
| 6,365,840 B1 | * | 4/2002 | Honda et al. | ............ 174/259 |

FOREIGN PATENT DOCUMENTS

JP      63-5554     11/1994

* cited by examiner

*Primary Examiner*—Thien M. Le
*Assistant Examiner*—April Nowlin
(74) *Attorney, Agent, or Firm*—Oliff & Berridge, PLC

(57) ABSTRACT

An exposure substrate of the invention is characterized in that at least one mark representing information related to the exposure substrate is provided on a part of the exposure substrate, and at least one of the marks contains information related to a mark readout operation. This information may include; the number, the position, or the order for reading the other marks to be read, or an end of information to be read. According to the present invention, information for other marks can be obtained from one mark, therefore, an optional number of marks can be read automatically.

12 Claims, 4 Drawing Sheets

US 6,523,748 B1

SUBSTRATE FOR EXPOSURE, READOUT METHOD AND APPARATUS FOR THE SUBSTRATE, EXPOSURE APPARATUS, AND METHOD FOR PRODUCING SEMICONDUCTOR DEVICES USING THE EXPOSURE APPARATUS

BACKGROUND OF THE INVENTION

1. Field of the Invention

The present invention relates to exposure substrates such as reticles, masks, wafers or the like used for a semiconductor manufacturing apparatus, a liquid crystal substrate manufacturing apparatus or the like, a method and an apparatus for reading information thereof, an exposure apparatus, and a semiconductor device manufactured using these.

The present application is based on Japanese Patent Application No. Hei 11-54816, and the description of the application is incorporated herein as a part of this application.

2. Description of the Related Art

In a photolithography process which is a part of a semiconductor manufacturing process or a liquid crystal display manufacturing process, an exposure substrate such as a reticle, a mask, a wafer or the like is used for each process, and a circuit pattern formed on the reticle is printed to the exposure substrate, and the substrate is subjected to the next process. However, usually patterns used for the photolithography process are different from each other.

Recently, information on an original plate for exposure such as a reticle, mask or the like, that is, information related to a reticle name or a pattern formed thereon, is formed on the original plate as a recognition mark such as a bar code or the like, and identification is made by reading the information automatically.

The recognition mark is divided into a plurality of blocks (segments) depending upon the quantity of necessary information (number of characters, etc.), and the blocks are arranged on the original plate. Therefore, in order to read the recognition mark, it is necessary to input a reader, information related to how many segments are used to constitute the bar code, before performing readout. For this reason, a switch mechanism is conventionally provided in the reader for setting the number of segments.

If the number of segments is fixed according to the required maximum quantity of information (number of characters, etc.) for all original plates, the above described operation for setting the number of segments can be omitted. In this case, however, not only is practical use of effective area on the original plate interfered with, but also the read time increases, since even an unnecessary segment filled with a blank mark or the like is read. Also, when the maximum information quantity increases, it will become difficult to deal with the information.

Accordingly, it is essential that a bar code constituted of an optional number of segments can be read. However, in the case where as described above, a switch mechanism is provided in the reader as a means for achieving this, since the number of segments changes depending upon an original plate, an operator must perform the switching operation. In this case, if the operator performs improper setting, for example, if the operator sets the number of segments smaller than the actual number, all of the segments to be read cannot be read. Therefore, erroneous information is informed to a host computer, and as a result, considerable damage may be caused in the production of an integrated circuit or the like.

SUMMARY OF THE INVENTION

In order to solve the above problems, an object of the present invention is to provide an exposure substrate having a mark such as a bar code divided into an optional number of segments, and this mark being automatically readable without manually setting the number of segments. Furthermore, another object of the present invention is to provide a method and an apparatus for reading the information on the exposure substrate, an exposure apparatus, and a semiconductor device manufactured using these.

To solve the above described problems, an exposure substrate according to a first aspect of the present invention is characterized in that at least one mark representing information related to the exposure substrate is provided on a part of the exposure substrate, and at least one of the marks contains information related to a mark readout operation.

An exposure substrate according to a second aspect is characterized by including a mask on which an original picture of a pattern for exposure is drawn.

An exposure substrate according to a third aspect is characterized in that the information related to the mark readout operation includes information related to whether or not there is a mark to be read next.

An exposure substrate according to a fourth aspect is characterized in that the information related to whether or not there is a mark to be read next includes at least one of; the number, the position, the order of reading of said marks, and an end of information to be read.

An exposure substrate according to a fifth aspect is characterized in that the mark includes a bar code.

An exposure substrate according to a sixth aspect is characterized in that the information related to the readout operation is represented by a symbol of symbols expressed by the bar code, which is different from symbols expressing the information related to the substrate.

A seventh aspect is a method of reading information related to an exposure substrate by reading at least one mark provided on the exposure substrate, and is characterized in comprising: a detection step for detecting information contained in at least one of the marks and related to a mark readout operation; and a step for judging whether a next mark is to be read or not, based on a detection result of the detection step.

A method of reading information according to an eighth aspect is characterized in that the exposure substrate includes a mask on which an original picture of an exposure pattern is drawn.

A method of reading information according to a ninth aspect is characterized in that the information related to the mark readout operation which is detected in the detection step includes information related to whether or not there is a mark to be read next.

A method of reading information according to a tenth aspect is characterized in that the mark includes a bar code.

An eleventh aspect is an apparatus for reading information related to an exposure substrate by reading at least one mark provided on the exposure substrate, and is characterized by comprising: a detector for detecting information contained in at least one of the marks and related to a mark readout operation; and a control system connected to the detector for judging whether a next mark is to be read or not, based on a detection result of the detector.

A twelfth aspect is an exposure apparatus for exposing an object to be exposed by projecting an image of a mask pattern onto the object to be exposed, and is characterized in that the exposure apparatus comprises: a carrier apparatus for transporting the mask or the object to be exposed onto a stage; and a reader for reading information related to the mask or the object to be exposed, by reading at least one mark provided on the mask or the object to be exposed; and the information reader comprises; a detector for detecting information contained in at least one of the marks and related to a mark readout operation, and a control system connected to the detector for judging whether a next mark is to be read or not, based on a detection result of the detector.

A thirteenth aspect is a semiconductor device formed by using the exposure substrate according to the first aspect.

A fourteenth aspect is a semiconductor device formed by using the exposure apparatus according to the twelfth aspect.

According to the method and apparatus for reading information on the exposure substrate and the exposure apparatus, and the method for production of a semiconductor device using these, since the information related to the readout operation is read and it is judged whether a next mark is to be read or not based on the information. Therefore, if there is another mark to be read, the next mark will be automatically read, and it becomes possible to perform readout of only the necessary marks and complete the readout operation, even if the number of the marks is optional.

According to the exposure substrate of the present invention, since the information related to the mark readout operation is included in at least one of the marks expressing the information related to the substrate, information related to the other marks can be obtained from one mark, and an optional number of marks can be automatically read. As a result, a setting load of an operator can be reduced, and occurrence of damage due to operational errors can be prevented. Moreover, since marks can be arranged for each substrate, with the minimum number of segments, processing time required for reading the marks can be greatly reduced. Furthermore, since marks can be arranged with the minimum number of segments, the space on the substrate can be effectively utilized.

According to the exposure substrate of the second aspect, since the substrate is an original plate on which a pattern for exposure is formed, even with an original plate such as a reticle, a mask or the like, an optional number of marks can be automatically read.

According to the exposure substrate of the third aspect, since the information related to the mark readout operation includes information related to whether or not there is a mark to be read next, if there is no mark to be read next, unnecessary readout operations can be automatically reduced. Therefore, the processing time can be shortened.

According to the exposure substrate of the fourth aspect, since the information related to the mark readout operation includes at least one of; the number, the position, the order of reading of the marks, and end of information to be read, information related to a mark necessary for readout is automatically read. Therefore, the readout operation for each mark can be reliably performed automatically and effectively.

According to the exposure substrate of the fifth and sixth aspect, the mark is formed as a bar code, and the information related to the mark readout operation is represented by a symbol of symbols expressed by the bar code, which is different from symbols expressing the information related to the substrate. Therefore it can be easily determined if information is that of the readout operation or not, by recognizing if there is a special symbol or not at the time of reading the mark.

According to the information reading method of the seventh to the tenth aspects, the reading apparatus of the eleventh aspect, the exposure apparatus of the twelfth aspect and the semiconductor device of the thirteenth and fourteenth aspects, the information related to the readout operation is read, and based on the information, it is judged whether the next mark is to be read or not. Therefore if there is another mark which must be read, the next readout is automatically performed, and even if the number of marks is optional, unnecessary readout of marks can be avoided enabling efficient reading of the necessary marks. Moreover, the processing time required for transporting the substrate and recognition thereof in the exposure step or the like can be reduced.

DESCRIPTION OF THE PREFERRED EMBODIMENTS

Below is a description of one embodiment of an exposure substrate, a method and an apparatus for reading the information thereon, an exposure apparatus using these and a semiconductor device manufactured using these, in accordance with the present invention, with reference to FIG. 1 to FIG. 4, and FIG. 5A to FIG. 5D.

Figure 1:
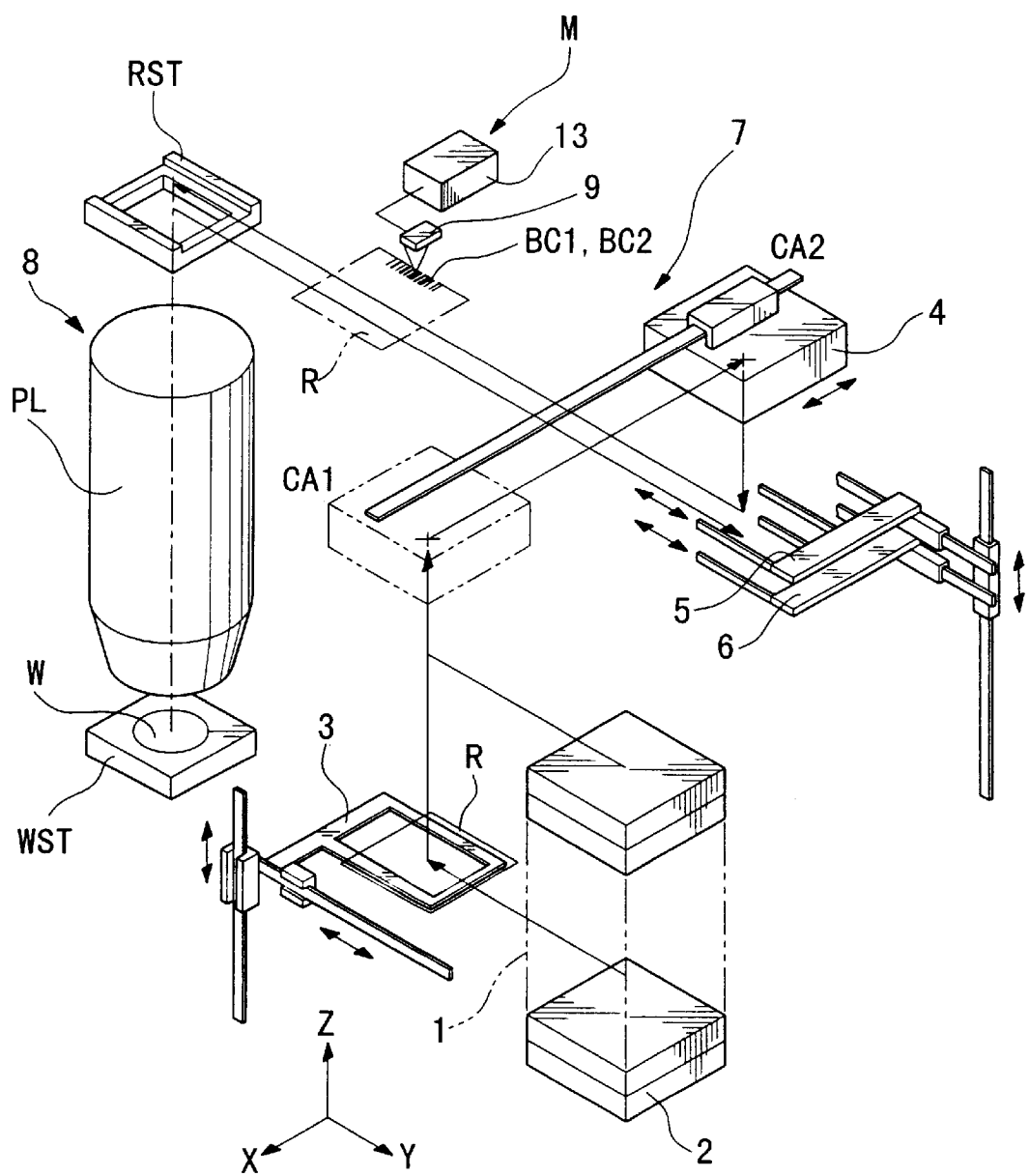
FIG. 1 is a schematic block diagram showing one embodiment of an exposure apparatus in which an exposure substrate reader according to the present invention is incorporated.

FIG. 1 is a schematic structural diagram of a semiconductor exposure apparatus in which a reader of this embodiment is incorporated. The exposure apparatus comprises: a reticle library 1 for keeping a plurality of reticle cases 2 which contain reticles (exposure substrates) used at the time of exposure; a reticle carrier system 7 for taking out a reticle R from a predetermined reticle case 2 and transporting this; and an exposure apparatus body 8. The exposure apparatus body 8 irradiates an exposure light from an illumination optical system (not shown) onto a reticle R carried and mounted on a reticle stage RST, to thereby project and expose a pattern formed on the reticle R onto a semiconductor wafer W on a wafer stage WST via a projection optical system PL.

The reticle R in the reticle case 2 kept in the reticle library 1 is stored in parallel with the X-Y plane in FIG. 1. Therefore, a carrier arm 3 for taking out a desired reticle R from the reticle case 2 and returning it to the reticle case 2 is provided so as to be moveable in the Y and Z directions.

The carrier arm 3 goes into the reticle case 2 mounted in the reticle library 1, taking out only a pre-specified reticle R in the Y direction, and moves up to an uppermost position in the Z direction as is, and carries the reticle R to a hand over position CA1 for handing over to a carrier 4.

The carrier arm 3 is provided with a vacuum attachment aperture (not shown), so that the reticle R can be held or released by means of a vacuum pump (not shown).

The carrier 4 can move in the X direction, and has an attachment aperture (not shown) on a lower part thereof. Also, the carrier 4 is provided with a pre-alignment mechanism (not shown) for clamping the reticle R from two directions and positioning the reticle R based on four sides thereof. The reticle R is carried by the carrier 4 from the hand over position CA1 to a position CA2.

A load arm 5 and an unload arm 6 are provided so that they can move in the Y direction and the Z direction. The load arm 5 and the unload arm 6 can move in the Y direction independently between the position CA2 and the reticle stage RST, and for the Z direction, they move together.

As well as the carrier arm 3, the load arm 5 and the unload arm 6 are provided with vacuum attachment apertures (not shown) for holding the reticle R, thereby enabling holding or releasing of the reticle R.

The reticle stage RST and the wafer stage WST are provided with an alignment mechanism (not shown) for adjusting the position of the reticle R and the semiconductor wafer W respectively mounted thereon.

The reticle carrier system 7 is provided with a reader M for reading bar codes (marks) BC1, BC2 on the reticle R while the reticle R is being carried to the reticle stage RST by the load arm 5. The reader M comprises a bar code reader 9 and a processing section 13. The bar code reader 9 irradiates a light for reading onto the bar codes BC1 and BC2 on the reticle R while being carried, and receives reflected light or transmitted light or scattered light thereof to read the information of the bar codes BC1 and BC2. The processing section 13 analyzes the information of the bar code reader 9 to thereby control the bar code reader 9 and the load arm 5. The bar code reader 9 may be located in any position on the reticle carrier path between the reticle library 1 and the reticle stage RST. In this embodiment, the processing section 13 controls the bar code reader 9 and the device for transporting the reticle R to the position of the bar code reader 9.

In the processing section 13, a specific symbol, for example "%", which is selected from characters or codes included in a bar code standard, is determined as a symbol indicating the first segment and the last segment in the readout barcode information. This symbol is not used as a symbol for other purposes.

For example, if there is a "%" at the head of a character string in a segment, the segment is recognized as the first segment, and if there is a "%" at the end of a character string in a segment, the segment is recognized as the last segment. In this embodiment, barcodes of the Code 39 standard can be used.

Figure 2:
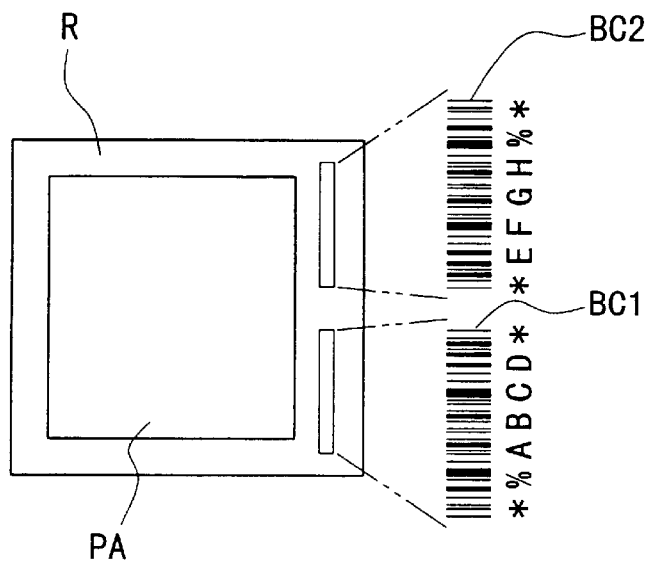
FIG. 2 is a schematic view showing one embodiment of an exposure substrate according to the present invention.
Figure 3:
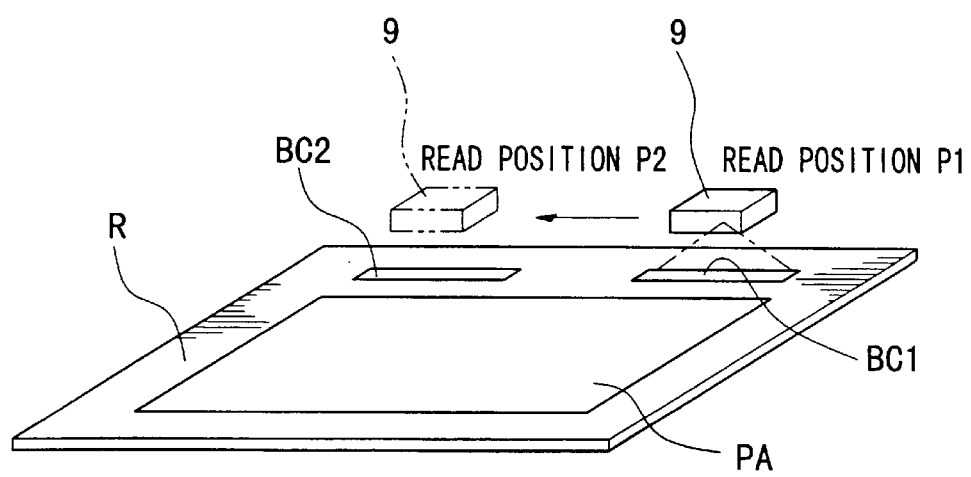
FIG. 3 is a schematic perspective view showing a positional relationship of a reticle and a bar code reader, in an embodiment of an exposure apparatus in which an exposure substrate reader according to the present invention is incorporated.

On the reticle R, as shown in FIG. 2, bar codes BC1 and BC2 representing the information of the reticle R divided into two segments, are provided in series in the vicinity of one side of the reticle R, outside of a pattern area PA where a circuit pattern is formed. When the reticle R is carried by the load arm 5, the bar code BC1 is read first by the bar code reader 9, as shown in FIG. 3.

In this embodiment, the bar codes BC1 and BC2 are provided on the upper face of the reticle R, but they may be provided on the side or lower face (a face where the circuit pattern is formed) of the reticle R.

The bar code BC1 which is read first contains the above described specific identification symbol, for example, "%" in the position next to "*", which is a start character, that is, at the head of the character string, and the bar code BC2 contains "%" at the end of its character string.

Moreover, for the other character strings, for example, "ABCD" and "EFGH" are respectively arranged in the bar code BC1 and BC2 as bar codes, and, "%ABCD" is assigned to the bar code BC1, and "EFGH%" is assigned to the bar code BC2, as the character string.

Next is a description of a method for reading the bar codes BC1 and BC2 on the reticle R by means of the reader M, with reference to FIG. 2 and FIG. 3.

First, the load arm 5, while transporting the reticle R to the reticle stage RST, carries the reticle R to a read position P1, as shown in FIG. 3, where the bar code reader 9 can read the bar code BC1, and stops in this position. Thereafter, the bar code reader 9 reads the information of the bar code BC1.

At this time, the processing section 13 automatically recognizes that the bar code BC1 is the first segment and not the last segment, since "%" is contained at the beginning of the character string but is not contained at the end of the character string, in the bar code BC1 which is read. Therefore, in order to read the next segment, the processing section 13 controls the load arm 5 to transport the bar code BC2 to a position P2 where the bar code reader 9 can read the bar code BC2, to thereby read the information of the bar code BC2.

For the convenience sake, FIG. 3 illustrates that the reticle R moves relative to the bar code reader 9. However, the bar code reader 9 may be provided with a movement mechanism, so that the bar code reader 9 can be moved relative to the reticle R, or both of the bar code reader 9 and the reticle R may be moved.

Next, the processing section 13 automatically recognizes that the bar code BC2 is the last segment, since "%" is not contained at the beginning of the character string but is contained at the end of the character string, in the bar code BC2 which is read, and judges that there is no segment to be read next. Then, the processing section 13 completes the readout and controls the load arm 5 to transport the reticle R to the reticle stage RST. Thereafter, alignment adjustment of the reticle R is performed at the reticle stage RST, and exposure processing is performed with respect to the semiconductor wafer W.

Next is a description of a method for reading the reticle R having a bar code comprising other segment constructions, with reference to FIG. 4 and FIG. 5A to FIG. 5D.

Figure 4:
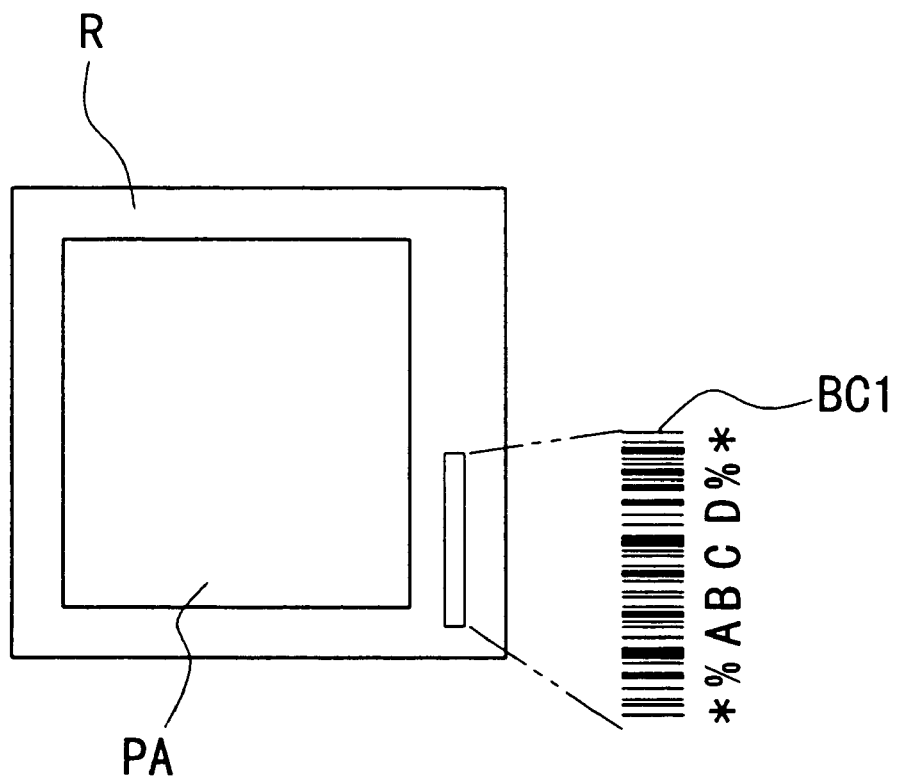
FIG. 4 is a plan view showing another example of a bar code, in an embodiment of an exposure apparatus according to the present invention.

As a modification of the bar code, for example as shown in FIG. 4, in the case where the reticle R has only one bar code BC1 as a segment for representing the information, the bar code BC1 contains a "%" at both the beginning and the end of the character string. Therefore, when the bar code BC1 is read, the processing section 13 automatically recognizes that the bar code BC1 is the first and the last segment, and the reticle R is carried to the reticle stage RST without performing a subsequent readout operation.

Similarly, the information may be represented by only one segment of the bar code BC2. In this case, the bar code BC2 contains "%" at both the beginning and the end of the character string. In this case, first, the bar code reader 9 tries to read a bar code at the read position P1. However, since a bar code is not marked, an index error occurs, and the processing section 13 controls the bar code reader 9 and/or the load arm 5 so as to perform the readout operation of the next segment at the read position P2.

Then, readout of the bar code BC2 is performed at the read position P2. Since the bar code BC2 contains "%" at the beginning and the end of the character string, it can be recognized that it is the first and the last segment, and that there is no bar code in the read position P1. At this point, the above described index error can be ignored, to thereby continue the processing.

FIG. 5A to FIG. 5D show as other examples, a case where the information is represented by a bar code comprising three segments on the reticle R.

Figure 5A:
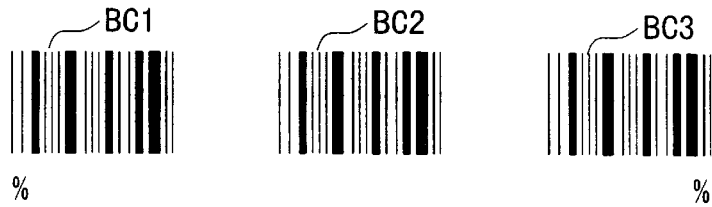
FIG. 5A to FIG. 5D are plan views respectively showing examples of bar codes comprising three segments, in an embodiment of an exposure apparatus according to the present invention.

In the case of the bar code shown in FIG. 5A, three segments, that is, the bar codes BC1, BC2 and BC3 are provided in series. In the bar code BC1 to be read first, the identification symbol "%" is contained at the beginning of the character string in the middle bar code BC2, "%" is not contained in the character string, and in the last bar code BC3, "%" is contained at the end of the character string.

In this case, when reading the first bar code BC1, the processing section 13 recognizes that the bar code BC1 is the first segment, and not the last segment, since "%" is contained at the beginning of the character string, and thus controls so as to read the next segment. Then, the bar code BC2 is read, and since there is no "%" in the character string, the processing section 13 recognizes that the bar code BC2 is not the first nor the last segment to be read, and thus controls the bar code reader 9 and/or the load arm 5 so as to read the next segment.

Then, the next bar code BC3 is read, and since there is "%" at the end of the character string, the processing section 13 recognizes that the bar code BC3 is the last segment, and thus controls to complete the readout operation and transport the reticle R to the reticle stage RST.

Figure 5B:
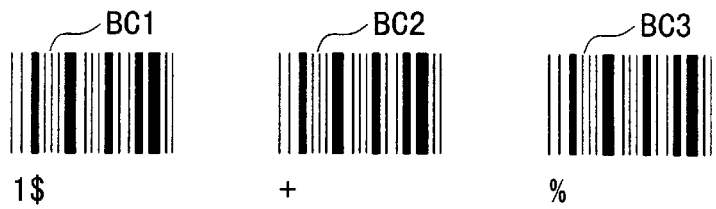

In the case of the bar code shown in FIG. 5B, bar codes BC1, BC2 and BC3 are provided in series. The bar code BC1 to be read first contains an identification symbol "$" at the beginning of the character string, the middle bar code BC2 contains an identification symbol "+" at the beginning of the character string, and the last bar code BC3 contains an identification symbol "%" at the beginning of the character string.

In this case, the processing section 13 is set beforehand so that it recognizes, when the identification symbol "$" is contained in the character string, that this is the first segment, when the identification symbol "+" is contained in the character string, that the segment is not the first nor the last, and when the identification symbol "%" is contained in the character string, that this is the last segment.

That is to say, when reading the bar code BC1 first, the processing section 13 recognizes that the segment is the first segment due to "$", reads the next segment, the bar code BC2, and recognizes that the segment is not the first nor the last due to "+", and then reads the next segment, the bar code BC3, and recognizes that the segment is the last segment due to "%", to thereby complete the readout operation, and then controls to carry out the next transport processing.

Figure 5C:

In the case of the bar code shown in FIG. 5C, bar codes BC1 and BC2 are provided in series, and a bar code BC3 is provided in parallel with the bar code BC2. The bar code BC1 to be read first contains an identification symbol "$" at the beginning of the character string, the bar code BC2 contains an identification symbol "+" at the beginning of the character string, and the bar code BC3 contains an identification symbol "%" at the beginning of the character string.

In this case, the processing section 13 is set beforehand so that it recognizes that when the identification symbol "$" is contained in the character string, a segment to be read next is located on the right side in FIG. 5C of the current segment, when the identification symbol "+" is contained in the character string, a segment to be read next is located on the lower side in FIG. 5C of the current segment (to the outer side and parallel with the current segment), and when the identification symbol "%" is contained in the character string, that this is the last segment.

That is to say, when reading the bar code BC1 first, the processing section 13 recognizes that the next segment is on the right side due to "$", and based on this recognition, moves the read position to the right side, to thereby read the next segment, the bar code BC2, and recognizes that the next segment is on the lower side, due to "+". Then, based on this recognition, the processing section 13 moves the read position downward, to read the next segment, the bar code BC3, and recognizes that the segment is the last due to "%", to thereby complete the readout operation and controls to carry out the next transport processing.

Figure 5D:

In the case of the bar code shown in FIG. 5D, bar codes BC1, BC2 and BC3 are provided in series, and only the bar code BC3 to be read last contains an identification symbol "%" which means the last segment, at the end of the character string. Also, in the case of this example, the sequence is predetermined so that readout is always carried out from the position of the bar code BC1.

That is to say, when reading the bar code BC1 first, since there is no identification symbol, the processing section shifts the read position to the next segment, to thereby read the bar code BC2. Since there is no identification symbol in the bar code BC2 either, the processing section shifts the read position to the next segment, to read the bar code BC3. At this time, since "%" is contained in the bar code BC3, the processing section 13 recognizes that this is the last segment. Thus, the readout operation is completed, and the processing section 13 controls to carry out the next transport processing.

The bar codes BC1, BC2 and BC3 shown in FIGS. 5 A to 5 D are expressed by the same code (combination of bars and spaces) for convenience sake, but actually, the form of the codes are different, since the symbols they represent are different.

The present invention also includes embodiments as described below.

(1) In the above described embodiment, information related to the readout operation of the reticle R is expressed by a mark in a bar code format, but marks in other formats may be used. For example, in the above described embodiment, a bar code comprising a code in which bars and spaces are arranged in a row is used, but a code composed of a plane (two-dimensional code) or the like may be used.

(2) As the identification symbols, "%", "$" and "+" are used, but other symbols such as characters or codes may be adopted, so long as it can be read and is not used in any other purpose. Also, the identification symbol may have the information related to the segment. Arrangement and definition of the identification symbol in the character string may be optionally determined. For example, a character or character string which follows "%" may be arranged at the end of a character string of each segment, and based on this character or character string, the first segment and the last segment may be identified.

(3) The exposure apparatus in this embodiment may be applied to a proximity exposure apparatus in which a mask and a substrate are put close to each other to expose a mask pattern, without using a projection optical system.

(4) As the application for the exposure apparatus, this is not limited to an exposure apparatus for semiconductor manufacturing, and for example, it can be widely applied as an exposure apparatus for liquid crystals, which exposes a liquid crystal display pattern on a rectangular glass plate, or as an exposure apparatus for producing a thin-film magnetic head.

(5) As a light source of the exposure apparatus in this embodiment, not only G-line (436 nm), I-line (365 nm), a KrF excimer laser (248 nm), an ArF excimer laser (193 nm) or a $F_2$ laser (157 nm), but also charged particle beams such as X-rays and electron beams may be used. For example, when electron beams are used, a thermionic emission type lanthanum hexaborite (LaB6) and tantalum (Ta) can be used as an electron gun.

(6) The magnification of the projection optical system may involve not only a reduction system, but also an equal magnification or enlarging system.

(7) As the projection optical system, when a far ultraviolet ray such as an excimer laser is used, a material which transmits the far ultraviolet ray, such as quartz and fluorite is used as a vitreous material, and when an $F_2$ laser or X-ray is used, a cata-dioptric system or a dioptric system is used (also the reticle to be used is a reflection type reticle). When an electron beam is used, an electron optical system comprising an electronic lens and a deflector may be used as the optical system. Also, it is a matter of course that the optical path through which the electron beam passes should be in a vacuum.

(8) When a linear motor (see U.S. Pat. No. 5,623,853 or U.S. Pat. No. 5,528,118) is used for the wafer stage and the reticle stage, either one of an air floating type which uses an air bearing and a magnetic floating type which uses a Lorentz's force or a reactance force may be used. Moreover, the stage may be a type that moves along a guide, or a guideless type without a guide.

(9) The reaction force generated by the movement of the wafer stage may be dispersed mechanically to the floor (ground) using a frame member (as described in U.S. Pat. No. 5,528,118).

(10) The reaction force generated by the movement of the reticle may be dispersed mechanically to the floor (ground) using a frame member (as described in U.S. Pat. No. 416,558).

(11) The exposure apparatus of this embodiment can be produced by incorporating an illumination optical system and a projection optical system comprising a plurality of lenses into the exposure apparatus body to perform optical adjustment, and mounting a reticle stage and a wafer stage comprising many mechanical parts on the exposure apparatus body and connecting wiring and piping, and performing overall adjustment (electrical adjustment, operation confirmation and the like). The production of the exposure apparatus is preferably performed in a clean room where temperature and cleanliness and the like are controlled.

(12) The semiconductor device is produced through a step for designing the function and performance of the device, a step for manufacturing reticles based on the design step, a step for manufacturing a wafer from a silicon material, a step for exposing a reticle pattern onto the wafer by the exposure apparatus of the aforesaid embodiment, a step for assembling the device (including steps of dicing, bonding and packaging) and an inspection step.

(13) The present invention can be attained by providing a bar code not only on a reticle or a mask but also, for example, on a scribe line on a photosensitive substrate such as a wafer or the like. That is to say, a code expressing individual information of a wafer may be added to the wafer. At this time, a special purpose reader becomes necessary for reading the information on the wafer.

What is claimed is:

1. An exposure substrate on which a first mark and a second mark respectively representing information related to the exposure is provided, wherein said second mark is disposed apart from said first mark so as to deviate from a measuring area of a mark reader when the mark reader reads the first mark, and at least one of said first and second marks contains information related to whether or not there is a mark to be read next.

2. The exposure substrate according to claim 1, wherein the exposure substrate includes a mask on which a pattern for exposure is provided.

3. The exposure substrate according to claim 1, wherein the information related to whether or not there is a mark to be read next includes at least one of: a number of the marks, a position of the marks, an order of reading the marks, and an end of information to be read.

4. The exposure substrate according to claim 1, wherein said first and second marks include bar code marks.

5. The exposure substrate according to claim 4, wherein the information related to whether or not there is a mark to be read next is represented by at least one symbol which is different from symbols expressed by the bar code for expressing the information related to the exposure substrate.

6. A semiconductor device manufactured by using the exposure substrate according to claim 1.

7. A method for reading information related to an exposure substrate by reading at least one mark provided on the exposure substrate, comprising:

detecting a first mark formed on the exposure substrate by a detector and obtaining information related to whether or not there is a mark to be read next; and changing a detection area of the detector on the exposure substrate and detecting a second mark on the exposure substrate disposed apart from said first mark based on a detection result of the detection step.

8. The method for reading information according to claim 7, wherein the exposure substrate includes a mask on which an exposure pattern is provided.

9. The method for reading information according to claim 7, wherein the first and second marks include bar code marks.

10. An apparatus for reading information related to an exposure substrate by reading at least one mark provided on the exposure substrate, comprising:

a detector that detects a first mark formed on the exposure substrate and obtains information related to whether or not there is a mark to be read next; and a control device connected to the detector that changes a detection area of the detector on the exposure substrate and detects a second mark on the exposure substrate disposed apart from said first mark based on a detection result of the detector.

11. An exposure apparatus for exposing an object to be exposed by projecting an image of a mask pattern onto the object, comprising:

a carrier device that transports a mask or the object onto a stage; and a mark reader for reading information related to the mask or the object by reading at least one mark provided on the mask or the object, wherein the mark reader comprises:

a detector that detects a first mark formed on the exposure substrate and obtains information related to whether or not there is a mark to be read next; and a control system connected to the detector that changes a detection area of the detector on the exposure substrate and detects a second mark on the exposure substrate disposed apart from said first mark based on a detection result of the detector.

12. A semiconductor device manufactured by using the exposure apparatus according to claim 11.

* * * * *